(12) United States Patent
Park

(10) Patent No.: US 7,547,239 B2
(45) Date of Patent: Jun. 16, 2009

(54) ORGANIC ELECTROLUMINESCENCE DEVICE AND FABRICATION METHOD THEREOF

(75) Inventor: Jae Yong Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 545 days.

(21) Appl. No.: 11/019,626

(22) Filed: Dec. 23, 2004

(65) Prior Publication Data
US 2005/0140276 A1 Jun. 30, 2005

(30) Foreign Application Priority Data
Dec. 30, 2003 (KR) ............... 10-2003-0099885

(51) Int. Cl.
*H01L 51/56* (2006.01)
(52) U.S. Cl. .......................... 445/25; 445/24
(58) Field of Classification Search ......... 313/500–512; 445/24, 25
See application file for complete search history.

(56) References Cited
U.S. PATENT DOCUMENTS
6,309,486 B1 * 10/2001 Kawaguchi et al. ........ 156/67

| 2003/0178936 | A1 * | 9/2003 | Park et al. | 313/505 |
|---|---|---|---|---|
| 2003/0222575 | A1 * | 12/2003 | Yamazaki et al. | 313/504 |
| 2004/0036410 | A1 * | 2/2004 | Park et al. | 313/504 |
| 2004/0137258 | A1 * | 7/2004 | Utsumi et al. | 428/629 |
| 2004/0232833 | A1 * | 11/2004 | Menda et al. | 313/512 |
| 2005/0140285 | A1 * | 6/2005 | Park et al. | 313/506 |

FOREIGN PATENT DOCUMENTS
KR 10230075771 A 9/2003

* cited by examiner

*Primary Examiner*—Mariceli Santiago
(74) *Attorney, Agent, or Firm*—Morgan Lewis & Bockius LLP

(57) ABSTRACT

An organic electroluminescence (EL) device includes first and second substrates spaced apart by a predetermined interval and facing each other; an array element having thin film transistors formed in a unit of sub-pixel on an inner surface of the first substrate; a color conversion portion disposed below the second substrate and having red (R), green (G) and blue (B) conversion layers for converting blue light into three primary colors of red (R), green (G) and blue (B); a lamination film formed below the color conversion portion; a first electrode disposed below the lamination film and made of a transparent conductive material; an organic EL layer formed in the unit of sub-pixel below the first electrode; a second electrode patterned in the unit of sub-pixel below the organic EL layer; and a conductive spacer electrically connecting the thin film transistors provided in the unit of the sub-pixels with the second electrode.

3 Claims, 4 Drawing Sheets

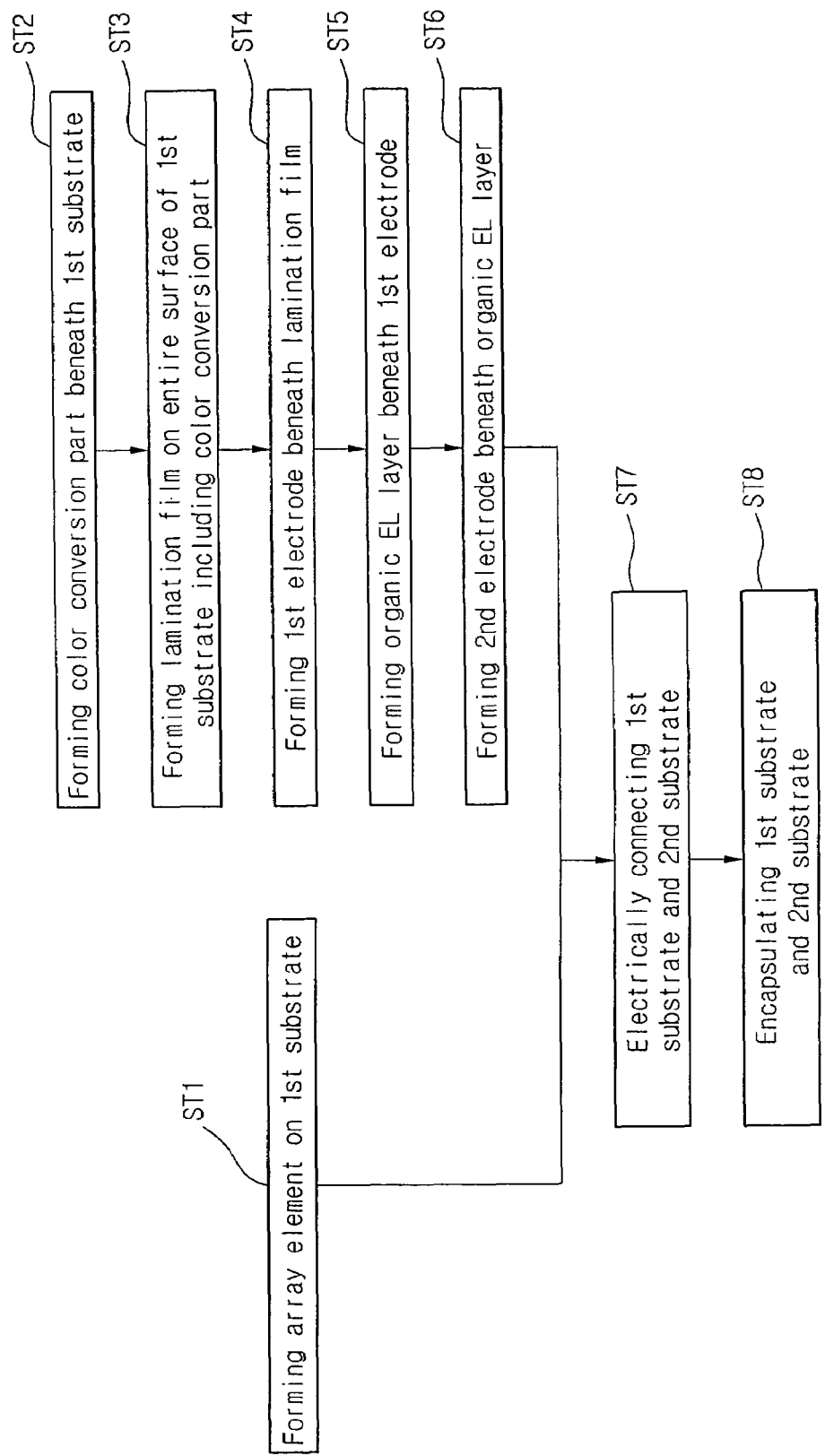

ORGANIC ELECTROLUMINESCENCE
DEVICE AND FABRICATION METHOD
THEREOF

The present invention claims the benefit of the Korean Application No. 99885/2003 filed on in Korea Dec. 30, 2003, which is hereby incorporated by reference.

BACKGROUND OF THE INVENTION

1. Field of the Invention

The present invention relates to a light emitting device, and more particularly, to an organic electroluminescence (EL) device and a method of fabricating the same.

2. Discussion of the Related Art

Among flat panel displays, an organic electroluminescence (EL) device is a self-emission type display with higher contrast and wider viewing angle as compared to a liquid crystal display (LCD). The organic EL device can be made lightweight and slim profile as compared to other display types because it does not require a backlight. The organic EL device also uses less power than other types of flat panel displays. Further, the organic EL device can be driven with a low DC voltage and still have a rapid response rate. Since all of the components of the organic EL device are formed of solid materials, it can withstand an impact. The organic EL device can operate throughout a wide temperature range and be manufactured at a low cost. Unlike fabricating an LCD or a PDP, the organic EL device is manufactured just using a deposition process and an encapsulation process. Thus, the manufacturing processes and apparatuses for making an organic EL device are very simple.

A passive matrix type organic EL device without a switching element has been widely used. In the passive matrix type, gate lines (scan lines) cross data lines (signal lines) to define a matrix of sub-pixels. The gate lines are sequentially driven to drive each sub-pixel. To exhibit a required mean luminescence, a higher level of moment luminance must be emitted sequentially in each sub-pixel across the display to create an overall average luminance.

In an active matrix type, thin film transistors acting as switching elements are located in respective sub-pixels. The voltage applied to the sub-pixels are charged in a storage capacitor Cst so that the voltage can be applied until a next frame signal is applied, thereby continuously driving the organic EL device, regardless of the number of gate lines, to display a picture. Accordingly, in the active matrix type, even when low current is applied, uniform luminescence can be obtained. As a result, the organic EL device has the advantages of low power consumption, high definition and large-sized screen capability. Such an active matrix type organic EL device will now be described with reference to the accompanying drawings.

FIG. 1 is a cross-sectional view schematically showing a bottom emission organic EL device according to the related art, wherein a unit pixel region includes red (R), green (G) and blue (B) sub-pixels. As shown in FIG. 1, the related art bottom emission organic EL device includes a first substrate 10 and a second substrate 30 facing each other and sealed by a seal pattern 40. The first substrate 10 includes a transparent substrate 1, thin film transistors T formed in each sub-pixel on the transparent substrate 1, first electrodes 12 connected with the thin film transistors T, an organic EL layer 14 connected with the thin film transistors T and disposed corresponding to the first electrodes 12 on the thin film transistors T, and a second electrode 16 formed on the organic EL layer 14. The organic EL layer 14 includes emission materials emitting red (R), green (G) and blue colors. The first and second electrodes 12 and 16 apply an electric field to the organic EL layer 14.

The second electrode 16 is spaced away from the second substrate 30 by the seal pattern 40. A moisture absorbent (not shown) for preventing moisture from leaking to an outside is filled into an inner surface of the second substrate 30 and fixed by a semi-transparent tape (not shown). In the related art bottom emission structure, the first electrode 12 serves as an anode and is selected from a group consisting of transparent conductive materials, whereas the second electrode 16 serves as a cathode and is selected from a group consisting of metal materials having a low work function. Thus, the organic EL layer 14 has a stack structure where a hole injection layer 14a, a hole transporting layer 14b, an emission layer 14c, an electron transporting layer 14d that are sequentially stacked starting from the hole injection layer 14a contacting the first electrode 12. Herein, the emission layer 14c has a structure in which the emission materials emitting red (R), green (G) and blue colors are sequentially arranged corresponding to the respective sub-pixels.

The related art organic EL device has a limitation in fine-patterning the red (R), green (G) and blue pixels with high reproduction under a large area. For example, since the organic EL material for the organic EL layer 14 is vulnerable to solvent or moisture, it cannot be patterned by a wet etch. For this reason, the organic EL material cannot be patterned by photolithography, which is advantageous in forming fine patterns.

Low molecular organic EL material can be patterned by a method including installing a fine-patterned shadow mask on a substrate and then independently forming R, G, B materials. However, this method is limited in precisely fabricating the shadow mask to have fine patterns over a resolution of a predetermined level and employing the shadow mask in a high definition and large area due to the tension deviation of the shadow mask and the like. Also, another pixel patterning method using a high molecular organic EL material inkjet injection head has been researched, but it is difficult for forming a pinhole-free thin film less than 1000 Å.

The related art bottom emission structure organic EL devices are fabricated by attaching the first substrate 10 provided with an array device and an organic EL diode to the second substrate 30 for separate encapsulation. Thus, a yield of the organic EL display is determined by both of a yield of the array device and a yield of the organic EL diode, and therefore, an overall process yield is greatly limited to a latter process, namely, the process of forming the organic EL diode. For example, even though the array device is formed excellently, if defects occur due to foreign matters or other factors in forming the organic EL layer employing a thin film of about 1000 Å thick, the entire organic EL device is rendered defective. Consequently, a defective organic EL layer results in decreased production yield and increased material costs in manufacturing the non-defective array element associated with the defective organic EL layer.

In addition, since the bottom emission structure has high stability and high process freedom because of the encapsulation, but has a limitation in the aperture ratio, it is suitable to employ the bottom emission structure for high resolution products.

SUMMARY OF THE INVENTION

Accordingly, the present invention is directed to an organic EL device that substantially obviates one or more problems due to limitations and disadvantages of the related art.

An object of the present invention is to provide an organic EL device that can protect a first electrode and an organic EL layer from a gas discharged from a color conversion portion by forming a lamination film between the color conversion portion and the first electrode.

Another object of the present invention is to provide a method of fabricating an organic EL device that can protect a first electrode and an organic EL layer from a gas discharged from a color conversion portion by forming a lamination film between the color conversion portion and the first electrode.

Additional advantages, objects, and features of the invention will be set forth in part in the description which follows and in part will become apparent to those having ordinary skill in the art upon examination of the following or may be learned from practice of the invention. The objective and other advantages of the invention may be realized and attained by the structure particularly pointed out in the written description and claims hereof as well as the appended drawings.

To achieve these objective and other advantages and in accordance with the purpose of the invention, as embodied and broadly described herein, there is provided an organic EL device, including: a first substrate and a second substrate that are arranged spaced apart by a predetermined interval and face each other; an array element divided into sub-pixels and including thin film transistors formed in the sub-pixels; a color conversion portion disposed below the second substrate and including red (R), green (G) and blue (B) conversion layers for converting blue light into three primary colors of red (R), green (G) and blue (B); a lamination film disposed below the color conversion portion; a first electrode disposed below the lamination film and including a transparent conductive material; an organic EL layer disposed below the first electrode in the sub-pixels; a second electrode patterned below the organic EL layer in the sub-pixels; and a conductive spacer electrically connecting the thin film transistors with the second electrode.

In another aspect, the method of fabricating the organic EL device includes preparing a first substrate and a second substrate, each including red (R), green (G) and blue (B) sub-pixels; forming an array element including a switching element in each of the sub-pixels on the first substrate; forming a color conversion portion including a red (R), green (G) and blue (B) conversion layers and a black matrix layer interposed between the color conversion layers in each of the sub-pixels; forming a lamination film on an entire surface of the second substrate including the color conversion portion; forming a first electrode below the lamination film, the first electrode including a transparent conductive material; forming an organic EL layer below the first electrode; forming a second electrode in each of the sub-pixels below the organic EL layer; connecting the first and second substrates via a conductive spacer; and attaching the first and second substrates.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principles of the invention. In the drawings:

FIG. 4 is a flow diagram illustrating a method of fabricating an organic EL device according to another exemplary embodiment of the present invention.

DETAILED DESCRIPTION OF THE PREFERRED EMBODIMENTS

Reference will now be made in detail to the preferred embodiments of the present invention, examples of which are illustrated in the accompanying drawings.

Figure 1:
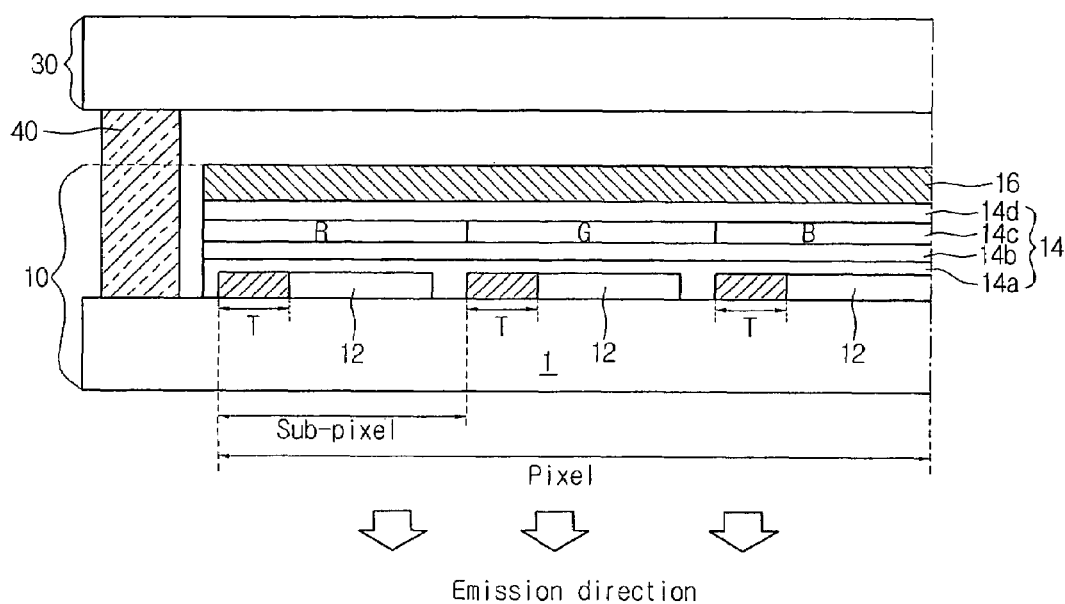
FIG. 1 is a cross-sectional view schematically showing a bottom emission organic EL device according to the related art.
Figure 2:
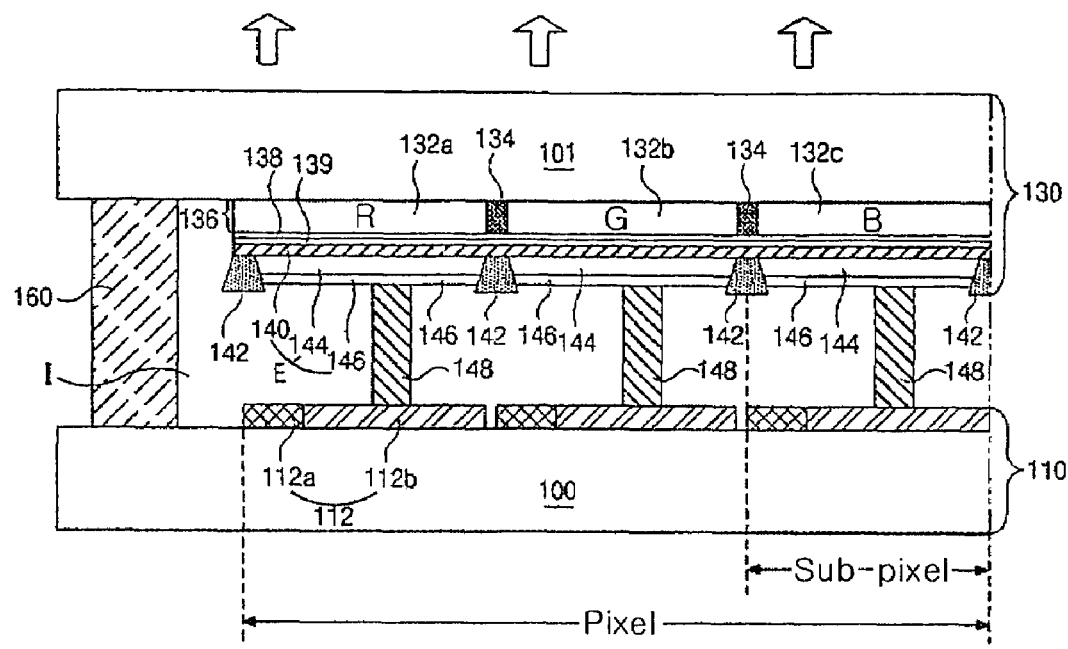
FIG. 2 is a cross-sectional view schematically showing a dual panel type organic EL device according to an exemplary embodiment of the present invention.

FIG. 2 is a cross-sectional view schematically showing a dual panel type organic EL device that exhibits colors in a color conversion medium (CCM) according to an exemplary embodiment of the present invention. The dual panel type organic EL device is capable of overcoming the drawbacks of the related art bottom emission type organic EL device. As shown in FIG. 2, the dual panel type organic EL device includes a first substrate 110 and a second substrate 130 disposed facing each other and attached by a seal pattern 160.

The first substrate 110 includes a transparent substrate 100 and an array element 112 formed on the transparent substrate 100. The second substrate 130 includes a transparent substrate 101, and a color conversion portion 136. The color conversion portion 136 including red (R), green (G) and blue (B) color conversion layers 132a, 132b and 132c sequentially arranged in a horizontal direction in the sub-pixel, and a black matrix (BM) layer 134 formed at boundaries between the R, G, B color conversion layers 132a, 132b and 132c to prevent color interference between colors and light leakage.

An overcoat layer 138 is deposited beneath the color conversion portion 136, and a first electrode 140 is deposited as a common electrode below the overcoat layer 138. The first electrode 140 may be made of a conductive material with light transmission capability. A trapezoidal electrode separator 142 of insulator is disposed at boundaries of the sub-pixels below the first electrode 142. An organic EL layer 144 and a second electrode 146 are sequentially and independently disposed between the adjacent electrode separators 142 and corresponding to each sub-pixel. Moreover, the color conversion portion 136 may include R, G and B color filters. Since the electrode separator 142 serves to pattern the second electrode 146 in each sub-pixel, the electrode separator 142 preferably has a trapezoidal structure in which width is reduced from the second electrode 146 to the first electrode 140.

The seal pattern 160 is formed along an edge between the first and second substrates 110 and 130 to attach them and to maintain a constant cell gap. The array element 112 on the first substrate 110 includes a thin film transistor 112a as a switching element, and an electrical connector 112b connected with the thin film transistor 112a. Conductive spacers 148 for electrically connecting the electrical connectors 112b of the first substrate 110 with the second electrode 146 of the second substrate 130 are formed in each sub-pixel. The thin film transistor 112a corresponds to a drive transistor connected with the organic EL diode E. The electrical connector 112b may correspond to any of source and drain electrodes (not shown) of the thin film transistor 112a, or may be made of a separate conductive material connected with the source and drain electrodes.

The organic EL layer 144 may be configured to include a blue color emission material having the highest energy among red, green and blue colors. The organic EL layer 144 has a multi-layered structure depending on the arrangement of anode and cathode. In one example, when the first electrode 140 and the second electrode 146 are designed to be cathode and anode, respectively, the organic EL layer 144 has the multi-layered structure such that a hole injection layer contacting the first electrode 140, a hole transporting layer, an emission layer, an electron transporting layer, an electron injection layer are sequentially arranged. Moreover, the conductive spacers 148 connecting the second electrode 146 with the thin film transistor 112a are formed between the second electrodes 146 and the electrical connectors 112b.

Unlike the general spacer used in a liquid crystal display (LCD), the conductive spacers 148 are used to electrically connect the two substrates as well as to maintain a cell gap between the two substrates 110 and 130, and each have a column shape having a predetermined height. In this exemplary embodiment, the conductive spacers 148 are formed by coating a conductive film on an insulator column spacer to electrically connect the two substrates 110 and 130 and also serve as spacers. Preferably, the conductive metal film coating the conductive spacer 148 is flexible and made of one selected from the group of metal materials having a low resistivity. The conductive spacer 148 may be formed during a process of forming an array device of the first substrate 110.

The above dual panel type organic EL device is a top emission type that emits light generated from the organic EL layer 144 toward the second substrate 130. Accordingly, the first electrode 140 should be selected from the group consisting of transparent conductive materials. If the first electrode 140 serves as an anode, it may be made of ITO. On the other hand, if the first electrode 140 serves as a cathode, it is preferably made of a semi-transparent metal material having a low work function. The semi-transparent metal material may be selected from the group consisting of aluminum (Al), an alloy of magnesium (Mg) and Al (hereinafter referred to as 'Mg:Al'), Al:Li and Al:benzonate. In addition, since the second electrode 146 is an electrode positioned at a rear side of the light emission direction, it is preferably selected from the group consisting of opaque metal materials. Thus, when the second electrode 146 serves as an anode, the second electrode 146 is made of ITO and the opaque metal material may be further provided so as to perform as a reflective plate. As shown in FIG. 2, there is an interval space I created between the first substrate 110 and the second substrate 130. It is preferably to forms the interval space I into an inert gas ambient.

Accordingly, as describe above, the organic EL device of the exemplary embodiment can overcome the disadvantages of the related art organic EL device in that finely patterned pixels cannot be formed, the yield in the bottom emission type is low and the aperture ratio is small.

In the organic EL device of the exemplary embodiment, to reproduce colors, the color conversion layer or the color filter is formed by a spin coating, a slit coating, an extrusion coating or the like that are solvent-based process, and a final baking. However, it is not easy to completely remove remaining solvent after the final baking. Even though the remaining solvent is completely removed, it takes time, thereby greatly decreasing productivity. Accordingly, to prevent the remaining solvent or moisture from permeating into the color conversion layers 132a, 132b and 132c, a barrier layer 139 is further deposited between the overcoat layer 138 and the first electrode 140, as shown in FIG. 2. Nonetheless, there still exists a moisture permeation path due to pinholes or foreign particles remaining in the color conversion layer and the like. Therefore, it is difficult to completely shield the permeation of the moisture and/or solvent.

The permeation of the moisture and/or solvent influences the organic EL layer 144 such that, when an electric field is applied to the first and second electrodes 140 and 146, a dark spot is formed, thereby negatively influencing reliability and reducing life span of the organic EL device.

Figure 3:
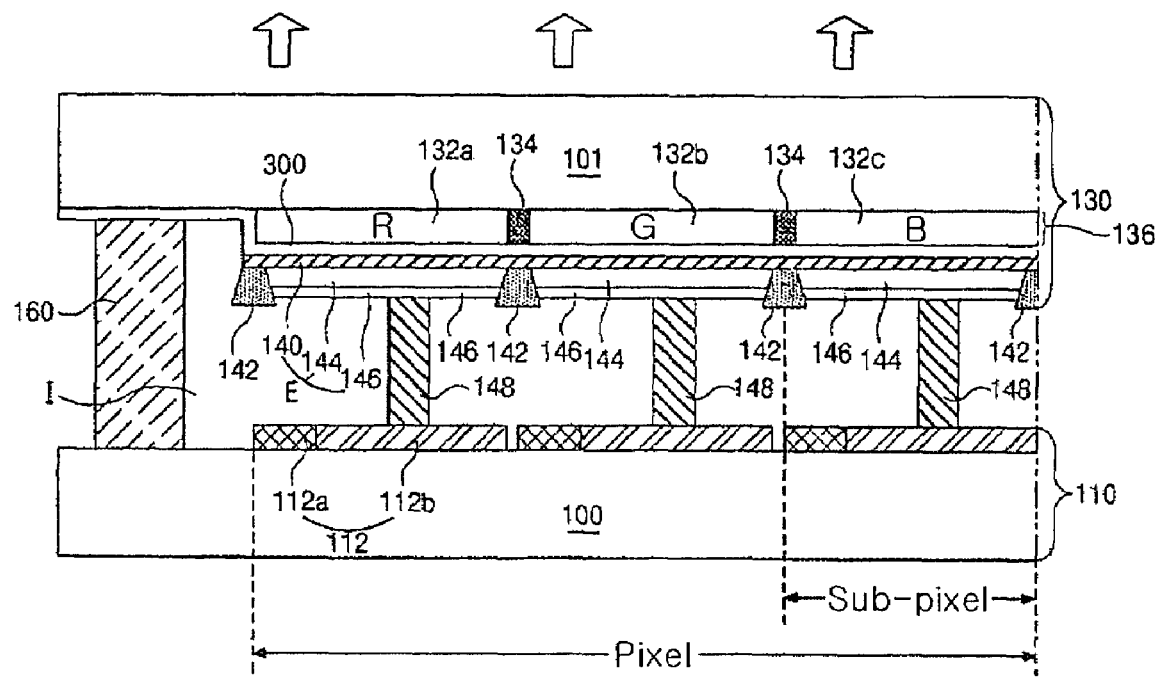
FIG. 3 is a cross-sectional view schematically showing a dual panel type organic EL device according to another exemplary embodiment of the present invention.

Next, another exemplary embodiment of the present invention aiming to solve the above problem will be described with reference to the accompanying drawings. FIG. 3 is a schematic sectional view of an organic EL device according to this exemplary embodiment. In the description of the embodiment shown in FIG. 3, the same reference numbers will be used to refer to the parts identical to those of the dual panel type organic EL device exhibiting colors in CCM way in FIG. 2. The description of the same or like parts will be omitted herein.

The exemplary embodiment is characterized in that a lamination film 300 is employed to replace the overcoat layer 138 (of FIG. 2) and the barrier layer 139 (of FIG. 2) disposed between the color conversion portion 136 and the first electrode 140 in the dual panel type organic EL device shown in FIG. 2. The lamination film 300 is deposited by attaching at least two thin films and is interposed between the color conversion portion 136 and the first electrode 140. Such an arrangement of the lamination film 300 can solve the problem caused by the overcoat layer and the barrier layer, e.g., incomplete shielding of the moisture and/or solvent.

The lamination film 300 may be made of a film having a low moisture permeability at a thickness of 30-100 nm. Also, the lamination film 300 may be deposited on the entire surface of the second substrate 130 including the color conversion portion 136 by a laminating process. Thus, by depositing the lamination film 300 having the sufficient thickness and the low moisture permeability on the entire surface of the second substrate 130, the lamination film 300 can simultaneously perform the moisture shielding and planarization functions during a period when the first electrode 140, the organic EL layer 144 and the second electrode 146 are formed, thereby simplifying the fabrication and increasing a life span of the organic EL device.

FIG. 4 is a flow diagram illustrating a method of fabricating an organic EL device according to another exemplary embodiment. As shown in FIGS. 3 and 4, at Step ST1, the array element 112 is deposited on the transparent substrate 100. Step ST1 includes forming a buffer layer on the transparent substrate 100, a semiconductor layer and a capacitor electrode on the buffer layer, forming a gate electrode, a source electrode and a drain electrode on the semiconductor layer, and forming a power electrode connected with the source electrode on the capacitor electrode. Also, at Stop ST1, forming the conductive spacer for an electrical connection between the first and second substrates 110 and 130 is further performed.

Next, at Step ST2, the color conversion layers 132a, 132b and 132c are formed in the sub-pixels in the order of R, G and B beneath the transparent substrate 101 of the second substrate 130, and then the BM layer 134 for preventing color interference and light leakage is formed at boundaries between color patterns of the color conversion layers 132a, 132b and 132c. The color conversion layers 132a, 132b and 132c and the BM layer 134 constitute the color conversion portion 136.

At Step ST3, the lamination film 300 is deposited on the entire surface of the second substrate 130 including the color conversion portion 136 by a laminating process. The lamination film 300 may be made of a film having low moisture permeability at a thickness of 30-100 nm.

At Step ST4, the first electrode 140 as the common electrode is formed beneath the lamination film 300. The first electrode 140 may be made of a conductive material having the light transmittance.

Thereafter, at Steps ST5 and ST6, the trapezoidal electrode separator 142 is formed of insulator at boundaries between the sub-pixels, and the organic EL layer 144 and the second electrode 146 are sequentially and independently disposed within the area of the sub-pixel defined as an area between the adjacent electrode separators 142 in the sub-pixel.

At Step ST7, the first substrate 110 and the second substrate 130 are electrically connected by the conductive spacer 148. Specifically, the TFT 112a or the electrical connector 112b connected with the TFT 112a on the first substrate 110 is connected with the second electrode 146 on the second substrate 130. In other words, the conductive spacer 148 connects the drive TFT 112a formed on the first substrate 110 with the organic EL diode E formed on the second substrate 130.

At Step ST8, the first and second substrates 110 and 130 are encapsulated. In other words, the seal pattern 160 is formed along an edge of any of the first and second substrates 110 and 130, and then, the first and second substrate 110 and 130 are attached. Step ST8 includes converting the interval space I between the first and second substrates 110 and 130 into a nitrogen atmosphere.

According to the organic EL device and fabrication method thereof provided in the present invention, the lamination film is formed instead of the overcoat layer and the barrier layer to completely shield gas discharged from the color conversion portion including the color filter or the color conversion layer, thereby increasing a life span of the device and improving the reliability and productivity.

It will be apparent to those skilled in the art that various modifications and variations can be made in the organic EL device and the method of fabricating the same of the present invention without departing from the spirit or scope of the invention. Thus, it is intended that the present invention cover the modifications and variations of this invention provided they come within the scope of the appended claims and their equivalents.

What is claimed is:

1. A method of fabricating an organic electroluminescence (EL) device, the method comprising:
    preparing a first substrate and a second substrate, each including red (R), green (G) and blue (B) sub-pixels;
    forming a switching element in each of the sub-pixels on the first substrate;
    forming a color conversion portion including a red (R), green (G) and blue (B) conversion layers and a black matrix layer interposed between the color conversion layers in each of the sub-pixels;
    forming a lamination film by attaching at least two thin films on substantially an entire surface of the second substrate including the color conversion portion;
    forming a first electrode below the lamination film, the first electrode including a transparent conductive material;
    forming an organic EL layer below the first electrode;
    forming a second electrode in each of the sub-pixels below the organic EL layer;
    connecting the first and second substrates using a conductive spacer; and
    joining the first and second substrates and providing a seal pattern beneath the lamination film,
    wherein the lamination film is formed of a film having a low moisture permeability and has a thickness of 30-100 nm,
    wherein the lamination film is formed below the color conversion portion to shield moisture discharged from the R, G and B color conversion layer.

2. The method according to claim 1, wherein the lamination film is formed by a laminating process.

3. The method according to claim 1, wherein the second substrate includes a transparent substrate and a portion of the lamination film is contacted to the transparent substrate.

* * * * *